United States Patent
Bower et al.

(10) Patent No.: US 10,297,585 B1
(45) Date of Patent: May 21, 2019

(54) MULTI-RESOLUTION COMPOUND MICRO-DEVICES

(71) Applicant: X-Celeprint Limited, Cork (IE)

(72) Inventors: Christopher Andrew Bower, Raleigh, NC (US); Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/850,049

(22) Filed: Dec. 21, 2017

(51) Int. Cl.
| | |
|---|---|
| *H01L 23/00* | (2006.01) |
| *H01L 25/00* | (2006.01) |
| *H01L 23/538* | (2006.01) |

(52) U.S. Cl.
CPC .......... *H01L 25/50* (2013.01); *H01L 23/5384* (2013.01); *H01L 23/5389* (2013.01); *H01L 24/19* (2013.01); *H01L 2224/24137* (2013.01)

(58) Field of Classification Search
CPC . H01L 25/50; H01L 23/5384; H01L 23/5389; H01L 24/19; H01L 2224/24137
See application file for complete search history.

(56) References Cited

U.S. PATENT DOCUMENTS

| | | |
|---|---|---|
| 5,821,571 A | 10/1998 | Lebby et al. |
| 6,142,358 A | 11/2000 | Cohn et al. |
| 6,184,477 B1 | 2/2001 | Tanahashi |
| 6,392,292 B1 | 5/2002 | Morishita |
| 6,825,559 B2 | 11/2004 | Mishra et al. |
| 6,936,855 B1 | 8/2005 | Harrah |

(Continued)

FOREIGN PATENT DOCUMENTS

| | | |
|---|---|---|
| WO | WO-2010/111601 A2 | 9/2010 |
| WO | WO-2010/132552 A1 | 11/2010 |

(Continued)

OTHER PUBLICATIONS

Choi, H. W. et al., Efficient GaN-based Micro-LED Arrays, Mat. Res. Soc. Symp. Proc. 743:L6.28.1-L6.28.6 (2003).

(Continued)

*Primary Examiner* — Elias Ullah
(74) *Attorney, Agent, or Firm* — William R. Haulbrook; Michael D. Schmitt; Choate, Hall & Stewart LLP

(57) ABSTRACT

A compound micro-assembled device comprises a device substrate. A first component having a first native resolution and a second component having a second native resolution different from the first native resolution are both disposed on the device substrate. The device substrate can comprise a device circuit having a native resolution different from or less than the first and second native resolutions. One or more device interconnections electrically connect the first component to the second component or to the device circuit. In certain embodiments, the first component or the second component can be micro-transfer printed onto the device substrate. In certain embodiments, the compound micro-assembled device can be micro-transfer printed onto a destination substrate or the compound micro-assembled device can comprise a destination substrate onto which the device substrate is micro-transfer printed. At least one of the first component and second components and, optionally, the device substrate, comprises at least a portion of a tether.

25 Claims, 9 Drawing Sheets

(56) References Cited

U.S. PATENT DOCUMENTS

| | | |
|---|---|---|
| 6,969,624 B2 | 11/2005 | Iwafuchi et al. |
| 7,009,220 B2 | 3/2006 | Oohata |
| 7,169,652 B2 | 1/2007 | Kimura |
| 7,195,733 B2 | 3/2007 | Rogers et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,198,621 B2 | 6/2012 | Rogers et al. |
| 8,261,660 B2 | 9/2012 | Menard |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,506,867 B2 | 8/2013 | Menard |
| 8,519,543 B1 | 8/2013 | Song et al. |
| 8,664,699 B2 | 3/2014 | Nuzzo et al. |
| 8,722,458 B2 | 5/2014 | Rogers et al. |
| 8,754,396 B2 | 6/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,877,648 B2 | 11/2014 | Bower et al. |
| 8,889,485 B2 | 11/2014 | Bower |
| 8,895,406 B2 | 11/2014 | Rogers et al. |
| 8,987,765 B2 | 3/2015 | Bibl et al. |
| 9,142,468 B2 | 9/2015 | Bower et al. |
| 9,178,123 B2 | 11/2015 | Sakariya et al. |
| 9,217,541 B2 | 12/2015 | Bathurst et al. |
| 9,355,854 B2 | 5/2016 | Meitl et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,496,155 B2 | 11/2016 | Menard et al. |
| 9,520,537 B2 | 12/2016 | Bower et al. |
| 9,537,069 B1 | 1/2017 | Bower et al. |
| 9,555,644 B2 | 1/2017 | Rogers et al. |
| 9,741,785 B2 | 8/2017 | Bower et al. |
| 9,761,754 B2 | 9/2017 | Bower et al. |
| 9,899,329 B2 | 2/2018 | Bower |
| 9,899,465 B2 | 2/2018 | Bower et al. |
| 2006/0063309 A1 | 3/2006 | Sugiyama et al. |
| 2008/0108171 A1 | 5/2008 | Rogers et al. |
| 2009/0023243 A1 | 1/2009 | Koyanagi |
| 2010/0123268 A1 | 5/2010 | Menard |
| 2010/0186883 A1 | 7/2010 | Tomoda |
| 2010/0248484 A1 | 9/2010 | Bower et al. |
| 2010/0317132 A1 | 12/2010 | Rogers et al. |
| 2011/0147715 A1 | 6/2011 | Rogers et al. |
| 2011/0244225 A1 | 10/2011 | Hattori et al. |
| 2012/0228669 A1 | 9/2012 | Bower et al. |
| 2012/0313241 A1 | 12/2012 | Bower |
| 2012/0314388 A1 | 12/2012 | Bower et al. |
| 2012/0320581 A1 | 12/2012 | Rogers et al. |
| 2013/0036928 A1 | 2/2013 | Rogers et al. |
| 2013/0069275 A1 | 3/2013 | Menard et al. |
| 2013/0196474 A1 | 8/2013 | Meitl et al. |
| 2013/0221355 A1 | 8/2013 | Bower et al. |
| 2013/0273695 A1 | 10/2013 | Menard et al. |
| 2013/0333094 A1 | 12/2013 | Rogers et al. |
| 2014/0084482 A1 | 3/2014 | Hu et al. |
| 2014/0159065 A1 | 6/2014 | Hu et al. |
| 2014/0264763 A1 | 9/2014 | Meitl et al. |
| 2014/0267683 A1 | 9/2014 | Bibl et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0263066 A1 | 9/2015 | Hu et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0372393 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0066789 A1 | 3/2016 | Rogers et al. |
| 2016/0086855 A1 | 3/2016 | Bower et al. |
| 2016/0093600 A1* | 3/2016 | Bower .................. H01L 25/18 257/89 |
| 2016/0308103 A1 | 10/2016 | Hu et al. |
| 2017/0025593 A1 | 1/2017 | Bower et al. |
| 2017/0047393 A1 | 2/2017 | Bower et al. |
| 2017/0187976 A1 | 6/2017 | Cok |
| 2017/0210117 A1 | 7/2017 | Rogers et al. |
| 2017/0213803 A1 | 7/2017 | Bower |
| 2017/0250167 A1 | 8/2017 | Bower et al. |
| 2017/0256521 A1 | 9/2017 | Cok et al. |
| 2017/0287789 A1 | 10/2017 | Bower et al. |
| 2017/0309698 A1 | 10/2017 | Bower et al. |
| 2018/0130751 A1 | 5/2018 | Bower |
| 2018/0138071 A1 | 5/2018 | Bower et al. |
| 2018/0151664 A1 | 5/2018 | Bower et al. |
| 2018/0226287 A1 | 8/2018 | Bower et al. |
| 2018/0277504 A1 | 9/2018 | Bower |
| 2018/0286734 A1 | 10/2018 | Meitl et al. |
| 2018/0323178 A1 | 11/2018 | Meitl et al. |

FOREIGN PATENT DOCUMENTS

| | | |
|---|---|---|
| WO | WO-2014/149864 A1 | 9/2014 |
| WO | WO-2016/046283 A2 | 3/2016 |
| WO | WO-2017/144573 A1 | 8/2017 |
| WO | WO-2018/091459 A1 | 5/2018 |

OTHER PUBLICATIONS

Hamer et al., 63.2: AMOLED Displays Using Transfer-Printed Integrated Circuits, SID 09 Digest, 40(2):947-950 (2009).

Lee, S. H. etal, Laser Lift-Off of GaN Thin Film and its Application to the Flexible Light Emitting Diodes, Proc. of SPIE 8460:846011-1-846011-6 (2012).

Cok, R. S. et al., AMOLED displays with transfer-printed integrated circuits, Journal of the SID, 19(4):335-341, (2011).

Cok, R. S. et al., Inorganic light-emitting diode displays using micro-transfer printing, Journal of the SID, 25(10):589-609, (2017).

* cited by examiner

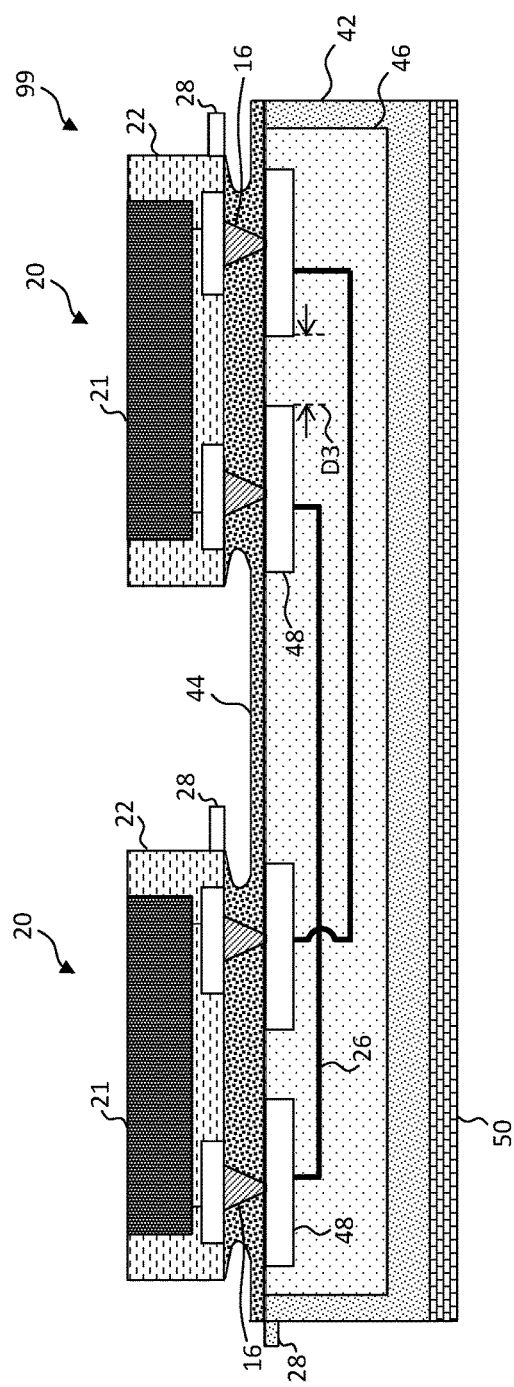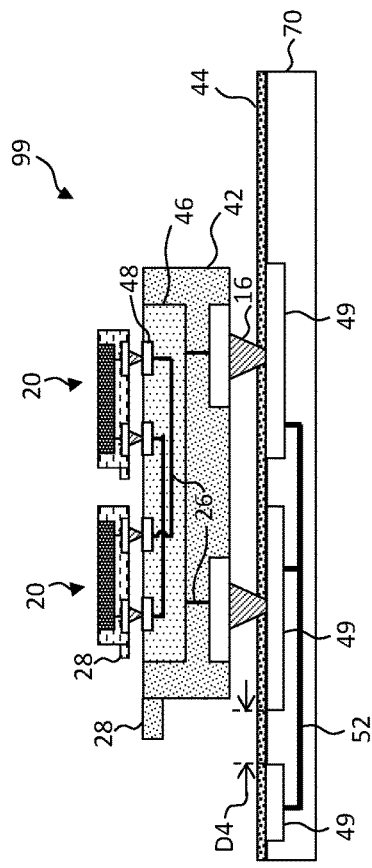
FIG. 3
FIG. 4

MULTI-RESOLUTION COMPOUND MICRO-DEVICES

REFERENCE TO RELATED APPLICATION

The present application is related to U.S. Patent Application Publication No. 2016/0093600 entitled Compound Micro-Assembly Strategies and Devices, by Bower et al.

FIELD OF THE INVENTION

The present invention relates generally to integrated heterogeneous micro-devices constructed using transfer printing (e.g., micro-transfer printing).

BACKGROUND OF THE INVENTION

Electronic and optical components are widely used in communication and sensing devices. Many such components comprise multiple integrated circuits constructed in different materials with different process integrated into a common device. Conventionally, multiple integrated circuits are assembled onto a common substrate such as a printed circuit board. The printed circuit board includes wiring that provides power, ground, and communication signals to the various multiple integrated circuits in the component.

A variety of methods are used for distributing electronically functional components over a substrate in the circuit board assembly industry including, for example, pick-and-place technologies for integrated circuits provided in a variety of packages such as pin-grid arrays, ball-grid arrays, and flip-chips. However, these techniques may be limited in the size of the integrated circuits that can be placed so that the integrated circuits and their packaging can be larger than is desired.

Another method for transferring active components from one substrate to another is described in U.S. Pat. No. 7,943,491. In an exemplary method, small integrated circuits are formed on a semiconductor wafer. The small integrated circuits, or chiplets, are released from the wafer by etching a layer formed beneath the circuits. A stamp (e.g., a PDMS stamp) is pressed against the wafer and the process side of the chiplets is adhered to the stamp. The chiplets are pressed against a destination substrate or backplane and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

Integrated circuits are becoming ever denser and their associated packages ever smaller. Conventional photolithographic processes can enable single, very dense circuits in a specific technology and material (e.g., silicon) at a process resolution. However, it is often desirable to use different materials and processes for the components in order to improve performance or to reduce construction costs. For example, logic circuits often use CMOS circuits constructed in silicon semiconductor materials. Power components can be made in compound semiconductor materials, for example gallium arsenide, that have a higher electron mobility than silicon and can therefore have higher performance for power applications. Optical components are also made in compound semiconductor materials that are well suited for emitting or absorbing light.

Various materials typically have different costs and performance for a desired application and device. Moreover, processing costs, such as photolithographic costs, can differ for different materials and at different resolutions. It is advantageous, therefore, to select materials and a processing resolution that provide desired performance and costs for different components in a desired application and device.

There remains a challenge for integrating multiple heterogeneous components into a common device at high density and a need for improved structures and methods for the integration of heterogeneous components incorporating different materials with different processing resolutions and having different costs.

SUMMARY OF THE INVENTION

Certain embodiments of the present invention provide, inter alia, compound micro-assembled devices comprising a device substrate, a first component having a first native resolution, the first component disposed on the device substrate, a second component having a second native resolution different from the first native resolution, the second component disposed on the device substrate, and one or more device interconnections electrically connecting the first component to the second component on the device substrate. At least one of the first component, the second component, and the device substrate comprises at least a portion of a tether. In some embodiments, either the first or second component or both of the first and second components comprises at least a portion of a tether and the device substrate optionally comprises at least a portion of a tether.

The first component can be formed at least partially in a first material, the second component can be formed at least partially in a second material, and the first and second materials can be a same material. The same material can be a semiconductor material forming a component substrate for the first and second components.

The device substrate can comprise a device material that is a semiconductor material. In some embodiments, the first component is formed at least partially in a first material, the second component is formed at least partially in a second material, and the first, second, and device materials are the same material. In some embodiments, the device material is the same as the first material or the second material or the first, second, and device materials are all different materials.

In some embodiments of the present invention, a device substrate comprises a device circuit disposed (e.g., formed) in or on the device material and the device circuit is electrically connected to at least one of the one or more device interconnections. The device circuit can have a device native resolution that is different from the first native resolution and different from the second native resolution or that is the same as one of the first native resolution and the second native resolution. The device native resolution can be less than the first native resolution and less than the second native resolution.

In some embodiments of the present invention, a first component and a second component are transfer printed (e.g., micro-transfer printed) onto the device substrate and each of the first components and the second components comprises at least a portion of a fractured or separated tether.

In some embodiments of the present invention, a compound micro-assembled device comprises a destination substrate comprising one or more destination substrate interconnections, a device substrate is disposed on the destination substrate, and one or more device interconnections are electrically connected to the one or more destination substrate interconnections. The one or more device interconnections can comprise one or more device interconnection materials and the one or more destination substrate interconnections can comprise one or more destination substrate interconnection material. The one or more device interconnection materials can be different from the one or more destination substrate interconnection materials, the one or more device interconnection materials can be made in a different process from the one or more destination substrate interconnection materials, or the one or more destination substrate interconnections can have a different native resolution from the one or more device interconnections.

According to certain embodiments of the present invention, a method of making a compound micro-assembled device comprises providing a device substrate having one or more device interconnections, providing a first component having a first native resolution on a first source wafer, providing a second component having a second native resolution different from the first native resolution, disposed on the device substrate, and micro-transfer printing the first component from the first source wafer onto the device substrate such that the first component comprises at least a portion of a fractured or separated tether and is electrically connected to the one or more device interconnections, and the second component is electrically connected to the one or more device interconnections.

In some embodiments of the present invention, the method comprises providing a second component on a second source wafer and micro-transfer printing the second component from the second source wafer onto the device substrate such that the second component comprises at least a portion of a fractured or separated tether and is electrically connected to the one or more device interconnections.

In some embodiments of the present invention, the method comprises forming one or more device interconnections before a first component is micro-transfer printed. In some embodiments of the present invention, the method comprises forming the one or more device interconnections after the first component is micro-transfer printed.

In some embodiments of the present invention, the method comprises forming electrical connections between components and one or more device interconnections by micro-transfer printing, such that micro-transfer printing a first component causes the first component to be electrically connected to the one or more device interconnections or micro-transfer printing a second component causes the second component to be electrically connected to one or more device interconnections, or both.

In some embodiments of the present invention, the method comprises providing a device source wafer comprising a device, providing a destination substrate comprising one or more destination substrate interconnections, and micro-transfer printing the device from the device source wafer onto the destination substrate, such that the device substrate comprises at least a portion of a fractured or separated tether and one or more device interconnections are electrically connected to the one or more destination substrate interconnections. Thus, in some embodiments, micro-transfer printing a device substrate causes one or more of the one or more device interconnections to be electrically connected to one or more of the one or more destination substrate interconnections.

In some embodiments, a device substrate includes an electronic device circuit, such as an integrated circuit, an active electronic circuit, or a CMOS electronic circuit. A display substrate can also be micro-transfer printed onto a destination substrate.

In some embodiments, a device substrate comprises silicon and components comprises a compound semiconductor, a III-V semiconductor, or a GaAs semiconductor. In other embodiment, a device substrate comprises a compound semiconductor or components comprise silicon.

In some embodiments, one or more electrically conductive connection posts protrude from a side of components. One or more electrical device contact pads are disposed on a device substrate and each connection post can be electrically connected to a device contact pad. An electronic component circuit can be formed in or on the component substrate and the one or more electrically conductive connection posts can be electrically connected to the component circuit. The components can be released and micro-transfer printed from a component source wafer to a device substrate.

In certain embodiments, a component source wafer includes a wafer of substrate material, a patterned sacrificial layer formed on or in the substrate material, the patterned sacrificial layer defining separate anchors between sacrificial portions of the sacrificial layer, and a component formed or disposed over each sacrificial portion and attached to the anchors by tethers over the sacrificial portion. In certain embodiments, a method of making a component source wafer includes providing a wafer of substrate material, forming or designating a patterned sacrificial layer formed on or in the substrate material, the patterned sacrificial layer defining separate anchors between sacrificial portions of the sacrificial layer, and forming or disposing a component over each sacrificial portion and attached to the anchors by tethers over the sacrificial portion.

In some embodiments, one or more electrically conductive connection posts protrude from a side of a device substrate. Each connection post can be electrically connected to a destination substrate contact pad on a destination substrate. A device circuit can be disposed or formed in or on the device substrate and the one or more electrically conductive connection posts can be electrically connected to a device circuit. The device substrates can be released and micro-transfer printed from a compound device source wafer to a destination substrate.

In certain embodiments, a compound device source wafer includes a wafer of substrate material, a patterned sacrificial layer formed on or in the substrate material, the patterned sacrificial layer defining separate anchors between sacrificial portions of the sacrificial layer, and a micro-transfer printed component disposed over each sacrificial portion and attached to the anchors by tethers over the patterned sacrificial layer. A method of making a compound device source wafer includes providing a compound device source wafer, providing a substrate having a patterned sacrificial layer formed on or in the substrate material, the patterned sacrificial layer defining separate anchors between sacrificial portions of the sacrificial layer, and micro-transfer printing at least one component from a component source wafer to the device substrate or to a layer formed on or over the device substrate over a sacrificial portion. The device substrate can be a semiconductor substrate.

In certain embodiments, components comprise an encapsulation layer formed on a side of layers forming the component opposite a component substrate or formed on a side of the layers forming the component that is substantially non-parallel to a surface of the device substrate on which the component is micro-transfer printed. In certain embodiments, the encapsulation layer comprises at least a portion of a tether or is chemically etch-resistant.

In certain embodiments, a device or component substrate is chemically etch-resistant and comprises at least a portion of a tether. In certain embodiments, one or more layers in or on a device or component substrate comprises one or more of an electrical insulator, a patterned electrical insulator, a dielectric layer, a patterned dielectric layer, an electrical conductor, or a patterned electrical conductor. In certain embodiments, the device substrate includes an active electronic device circuit comprising active elements electrically connected to the component with electrical conductors on the device substrate. In some embodiments, the active electronic device circuit controls the component. In certain embodiments, the active elements comprise CMOS transistors.

Embodiments of the present invention enable, inter alia, compound micro-assembled devices comprising a variety of different heterogeneous materials that can each be processed or assembled separately using different, possibly incompatible, processes at higher densities and with different native resolutions, thereby reducing costs and improving performance. By micro-transfer printing multiple, different components having power, logic, control, sensing, or light output circuits onto a device substrate having logic or control circuits, manufacturing cycle time and costs are reduced and higher performance enabled in a more highly integrated device with a smaller size.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 3 is a cross section of a compound micro-assembled device according to illustrative embodiments of the present invention;

FIG. 4 is a cross section of a compound micro-assembled device according to illustrative embodiments of the present invention;

Figure 1A:
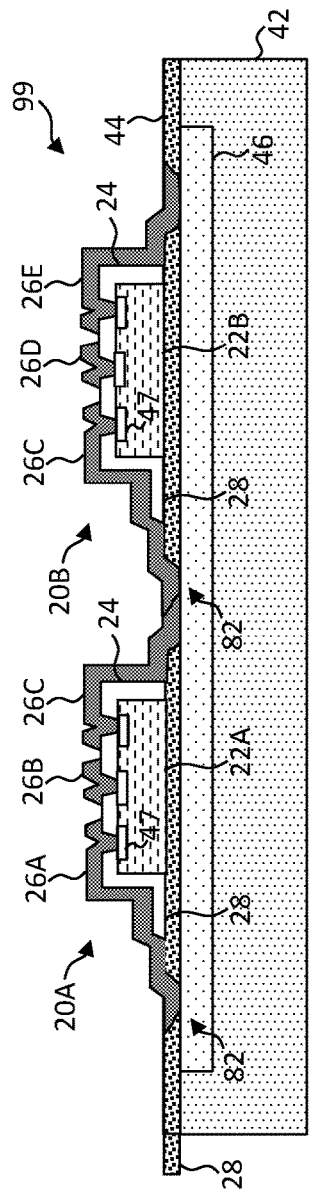
FIG. 1A is a cross section of a compound micro-assembled device according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Embodiments of the present invention are addressed to providing, inter alia, devices comprising two or more heterogeneous components assembled onto a common device substrate, for example by micro-transfer printing. Heterogeneous components can be integrated circuits, for example electronic, optical, mechanical, opto-electronic, electro-mechanical, or opto-mechatronic circuits (or any one or any combination of such integrated circuits) comprising different materials or made using different processing methods and comprising at least two different native resolutions. An integrated circuit is a structure or circuit made in or on a separate, individual substrate.

By using different native resolutions for at least two of the components, each component can be made to provide a desired performance at or near a desired cost. In contrast, constructing components in a common material at a common resolution or in a common component can compromise the performance or cost of one or more of the components. According to embodiments of the present invention, a component native resolution is defined by the smallest structure or the smallest spacing between two structures defined in the component. Components can be made using photolithographic methods and the native component resolution of the components can be the smallest photolithographically defined structure or spacing in the component.

Figure 1B:
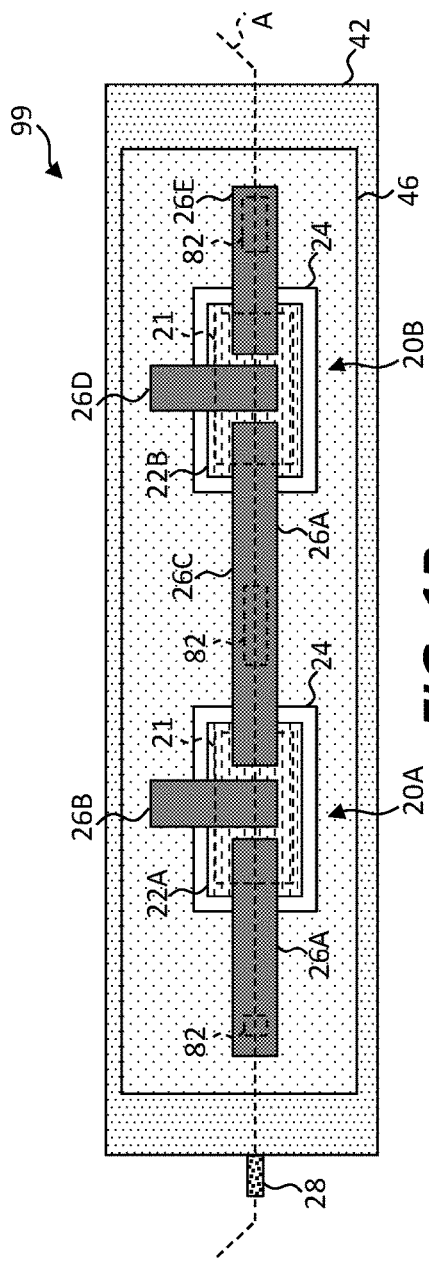
FIG. 1B is a plan view of a compound micro-assembled device according to illustrative embodiments of the present invention corresponding to FIG. 1A.
Figure 10B:
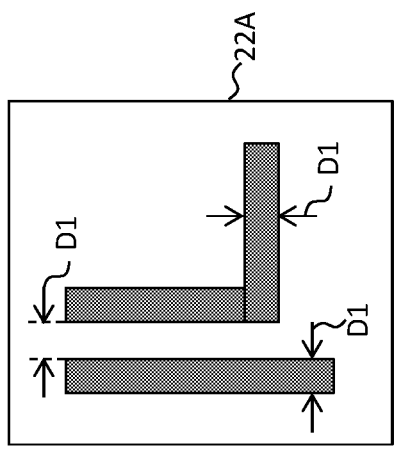
FIGS. 10A and 10B are plan views of semiconductor component substrates having different native resolutions according to illustrative methods of the present invention.
Figure 10A:
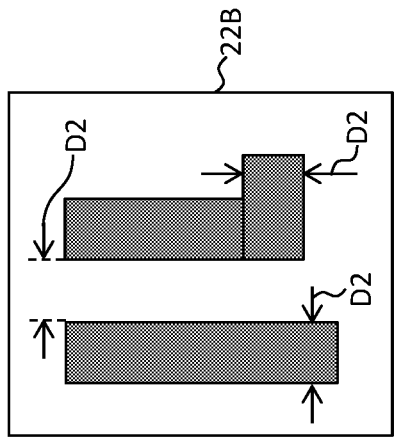

An illustrative embodiment of the present invention is shown in the plan view of FIG. 1B and the corresponding cross section of FIG. 1A taken across cross-section line A of FIG. 1B. Referring to FIGS. 1A and 1B, a compound micro-assembled device 99 comprises a device substrate 42, a first component 20A disposed on, in, or over the device substrate 42, and a second component 20B disposed on, in, or over the device substrate 42, for example by micro-transfer printing. The first and second components 20A, 20B (collectively components 20) can be disposed directly on the device substrate 42 or in, on, or over a layer disposed on the device substrate 42. In accordance with FIG. 10A, the first component 20A has a component circuit 21 with a first component structure separation (or size) D1. In accordance with FIG. 10B, the second component 20B has a component circuit 21 with a second component structure separation (or size) different from the first component structure separation (or size) D2. Component structure separation or size can refer to the width of the smallest structure (e.g., a smallest wire width or transistor structure) or the smallest separation between two structures (e.g., the smallest gap between two wires). The structure separation or size is inverse to the native resolution, so that the greater the structure separation or size, the lower the native resolution and the smaller the structure separation or size the higher the native resolution.

Referring to FIGS. 1A and 1B, one or more device interconnections 26A, 26B, 26C, 26D, 26E, for example metal or metal alloy wires or traces, electrically connect the first component 20A to the second component 20B on the device substrate 42, for example through component contact pads 47 on the components 20. Device interconnections 26A, 26B, 26C, 26D, 26E are collectively referred to as device interconnections 26 or electrodes 26. At least one of the first component 20A, the second component 20B, and the device substrate 42 comprises at least a portion of a broken (e.g., fractured) or separated tether 28. In some embodiments, either one of a first component 20A and a second component 20B comprises at least a portion of a broken (e.g., fractured) or separated tether 28, or both of the first component 20A and the second component 20B comprise at least a portion of a broken (e.g., fractured) or separated tether 28, and the device substrate 42 optionally comprises or is connected to at least a portion of a broken (e.g., fractured) or separated tether 28. In some embodiments, at least one of a component 20 and a device substrate 24 comprises at least a portion of each of two or more tethers 28.

A first component 20A can comprise a first semiconductor component substrate 22A in or on which a first integrated circuit is formed and a second component 20B can comprise a second semiconductor component substrate 22B in or on which a second integrated circuit is formed (collectively semiconductor component substrates 22). Components 20 or component substrates 22 can be adhered to a device substrate 42 or to a layer on the device substrate 42 with an adhesive layer 44. Device interconnections 26 can be insulated from first and second semiconductor substrates 22A, 22B and first and second integrated circuits by a patterned encapsulation or dielectric layer 24 or structure, for example comprising photolithographically defined oxide or nitride materials. Component substrates 22 can be but are not necessarily semiconductor substrates. Components 20 can be encapsulated by an encapsulation layer 24 (e.g., a dielectric layer) as discussed further below with respect to FIG. 6.

A device substrate 42 can be (but is not necessarily) a doped or undoped semiconductor material. A compound micro-assembled device 99 can also comprise a device circuit 46 disposed or formed in or on the device substrate 42. In some embodiments, and referring again to FIGS. 1A and 1B, the device circuit 46 is electrically connected to the first and second components 20A, 20B and corresponding first and second integrated circuits in the first and second semiconductor substrates 22A, 22B through the device interconnections 26 and vias 82, for example by wires disposed in the vias 82 formed through the adhesive layer 44. In some embodiments, wires are disposed in vias 82 formed through dielectric layers formed on, in, or over a device substrate 42 and device circuit 46. In some embodiments, first and second components 20A, 20B are directly connected on a device substrate 42 through device interconnections 26, as shown in FIGS. 1A and 1B. In other embodiments, first and second components 20A, 20B are indirectly connected through device interconnections 26 in a device circuit 46, as shown in FIGS. 3 and 4 described below. According to certain embodiments of the present invention, either direct or indirect electrical connections between first and second components 20A, 20B constitutes one or more device interconnections electrically connecting the first component 20A to the second component 20B on a device substrate 42. In some embodiments, the device substrate 42 is not a semiconductor substrate, for example the device substrate 42 is a glass, polymer, or ceramic substrate.

Referring to FIGS. 1A and 1B, the first and second semiconductor substrates 22A, 22B and the device substrate 42 are all different, distinct, separate, and independent substrates. A first and second semiconductor substrate 22A, 22B and device substrate 42 can be made of different materials at different times using different processes and can have different native resolutions. In some embodiments, at least some or some combinations of components 20, component circuits 21, device substrate 42, and device circuit 46 can comprise a same material or materials, can be made using similar processes, or can have the same native resolution. For example, a device circuit 46 can have a device substrate structure separation D3 that is different from both first and second component structure separations D1, D2, that is the same as the first component structure separation D1, or that is the same as the second component structure separation D2. In some embodiments, a device substrate structure separation or size D3 is greater than both the first component structure separation or size D1 and the second component structure separation or size D2 such that the native resolution of the device substrate 42 and device circuit 21 is less than the native resolutions of the components 20. Such different structures, processes, or native resolutions can reduce manufacturing costs without necessarily reducing compound micro-assembled device 99 performance.

In some embodiments, a first component 20A is formed at least partially in a first material, a second component 20B is formed at least partially in a second material, and the first and second materials are a same material. The same material can be a semiconductor material forming a component semiconductor substrate 22 for each of the first and second components 20A, 20B. In some embodiments, first and second materials are different materials. In some embodiments, a device substrate 42 comprises a device material that is the same as or comprises the first material, is the same as or comprises the second material, is the same as or comprises both the first and second materials, or comprises a material that is different from the first material and different from the second material. Different components 20 can have different sizes, respond differently to signals having different frequencies, or perform different functions. The different components 20 can be different integrated circuits. Such materials and different components 20 can reduce manufacturing costs without necessarily reducing compound micro-assembled device 99 performance.

First and second semiconductor substrates 22A, 22B can comprise crystalline silicon semiconductor or a compound semiconductor, such as a III/V semiconductor such as GaAs or GaN. An adhesive layer 44 can be a curable resin, the material of the dielectric layer 24 can be an oxide or nitride such as silicon oxide, silicon dioxide, or silicon nitride. A dielectric layer 24 can at least partially encapsulate components 20. Device interconnection electrodes 26 can be a metal or metal alloy, comprising metals such as aluminum, tungsten, titanium, tin, tantalum, silver, copper, or gold. In some embodiments, device interconnection electrodes 26 are a highly heat conductive metal, for example copper. In some embodiments, device interconnection electrodes 26 are transparent conductive oxides.

Any or all of these materials and structures can be deposited, patterned, and formed using photolithographic materials and processes. For example, dielectric layer 24 and electrodes 26 can be patterned using photolithographic and integrated circuit methods and adhesive layers 44 can be coated, for example spin or curtain coated, or laminated on the device substrate 42 or layers on the first semiconductor device substrate 42. Crystalline silicon and compound semiconductor substrates and structures, such as transistor structures, can also be formed using integrated circuit manufacturing methods. A device substrate 42 can also be a semiconductor, for example crystalline silicon semiconductor or a compound semiconductor, such as a 111/V semiconductor such as GaAs or GaN. In some embodiments, a device substrate 42 is a glass, plastic, or ceramic.

In some embodiments, either or both first and second semiconductor substrates 22A, 22B, or either or both first and second components 20A, 20B comprise a fractured, broken, or separated tether 28. The fractured, broken, or separated tether 28 can include a layer or structure formed on the corresponding semiconductor substrate 22 or component 20, for example an encapsulation or patterned dielectric layer 24. The tether 28 can be a fractured, broken, or separated tether 28 resulting from a micro-transfer print process. In some embodiments of the present invention, a device substrate 42 or compound micro-assembled device 99 also comprises a fractured tether 28, for example a fractured tether 28 made from a resin, an oxide, a metal, a semiconductor, silicon, polysilicon, or a device substrate 42 material physically connected to or a part of the device substrate 42.

First and second semiconductor substrates 22A, 22B can be adhered to a device substrate 42 with a layer 44 of adhesive disposed between the semiconductor substrates 22 and the device substrate 42 to adhere first and second components 20A, 20B to the device substrate 42. The first and second components 20A, 20B can be disposed over the device circuit 46 (as shown in FIGS. 1A and 1B, for example), or not. The adhesive layer 44 can be patterned and the first and second semiconductor substrates 22A, 22B can be smaller than the device substrate 42 such that the first and second semiconductor substrates 22A, 22B have an extent over the device substrate 42 that is smaller than the extent of the first and second components 20A, 20B. Furthermore, the first and second components 20A, 20B can have an extent over the device substrate 42 that is smaller than the extent of the device circuit 46.

Figure 2:
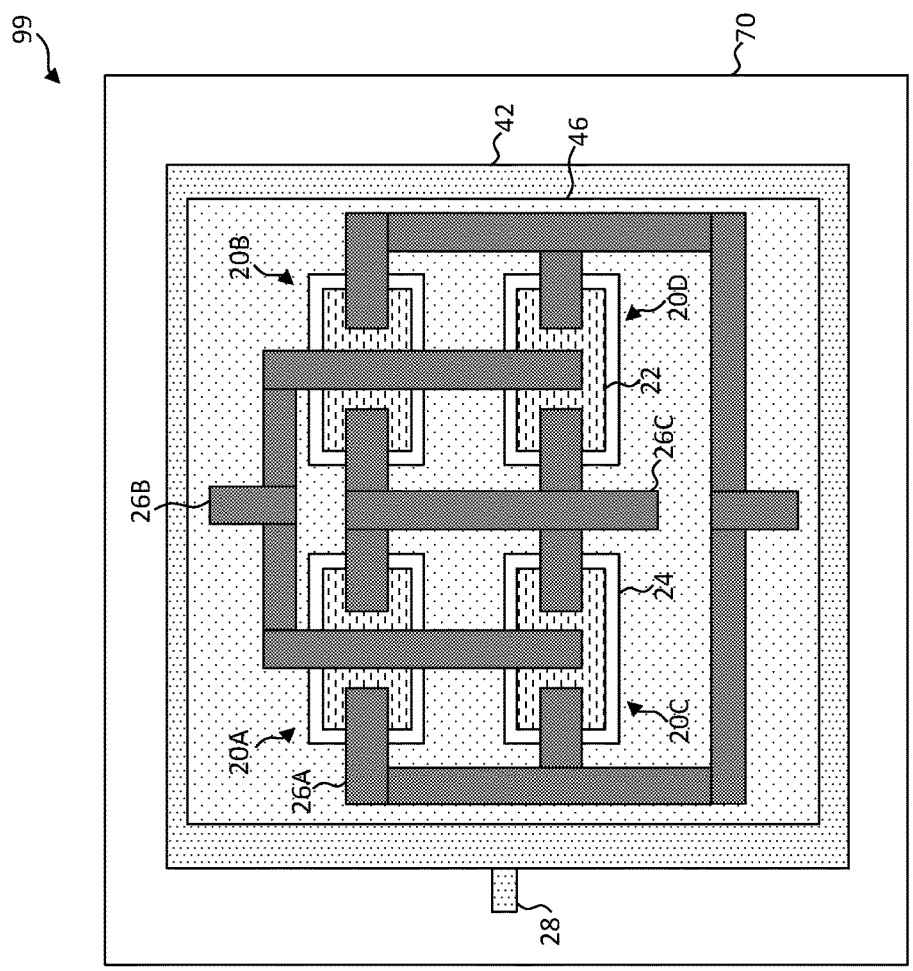
FIG. 2 is a plan view of a compound micro-assembled device according to illustrative embodiments of the present invention.

Referring next to the plan view of FIG. 2, in some embodiments of the present invention, a compound micro-assembled device 99 includes a plurality of first, second, third, and fourth components 20A, 20B, 20C, 20D (collectively components 20), each formed in or on a corresponding, independent, separate, and distinct semiconductor component substrate 22 with a patterned dielectric layer 24. The components 20 are all disposed on a common device substrate 42. In some embodiments, at least one component 20 is disposed on a different device substrate 42. As shown in FIG. 2, the four components 20A, 20B, 20C, 20D are electrically connected with device interconnections (electrodes) 26A, 26B, and 26C on or over the device substrate 42 or device circuit 46. Furthermore, one or more electrodes 26 can be connected to a device circuit 46 on or in the device substrate 42, for example as illustrated in FIG. 1A. As is also shown in FIG. 2, the device substrate 42 with components 20 and device interconnections 26 are disposed on a destination substrate 70, for example by micro-transfer printing.

Referring to FIG. 3 in another some embodiments of the present invention, a device substrate 42 or device circuit 46 of a compound micro-assembled device 99 includes one or more electrical device contact pads 48 disposed on, in, or over a device substrate 42. The device contact pad(s) 48 can also be described as electrical connection pad(s) and are electrically connected to the device circuit 46 through device interconnections 26. In some embodiments, contact pads 48 are connected to a device circuit 46 with other electrical connections. Components 20 can be electrically connected to the device contact pads 48 using conventional lithographically formed patterned wires or metal traces. In some embodiments, and as shown in FIG. 3, one or more electrically conductive connection posts 16 protrudes from a side of the component semiconductor substrate 22. Each electrical connection post 16 is electrically connected to a component circuit 21 of a corresponding component 20 with electrical connections or electrodes and is electrically connected to a corresponding contact pad 48, for example by micro-transfer printing the component 20 connection posts 16 onto or into the device contact pads 48.

Connection posts 16 and device contact pads 48 provide an electrical connection between an electronic device circuit 46, for example a control or power circuit or simple device interconnections 26, and component circuits 21 in components 20. In some embodiments, an optional heat spreader 50 is disposed on a side of a device substrate 42 opposite the components 20 (as shown in FIG. 3) or elsewhere. The heat spreader 50 can be in thermal contact with the device substrate 42 or semiconductor substrates 22 and diffuses the heat created by operating the components 20 and device circuit 46 to reduce the maximum temperature in a compound micro-assembled device 99. Such heat spreaders 50 can be, for example, metal, and can be deposited and optionally patterned using photolithographic materials and methods.

A device substrate 42 and device circuit 46 can have a device substrate structure separation or size D3 that is greater than the first or second component structure separation or size D1, D2 of first or second components 20A, 20B, respectively, or both. Thus, in some embodiments, the minimum separation between structures or the minimum structure size in the device substrate 42 and device circuit 46 is greater than the minimum separation between structures or the minimum structure size in the components 20 and the native resolution of the device substrate 42 and device circuit 21 is less than the native resolution of the first and second components 20.

Referring to FIG. 4, a device substrate 42 can also or instead have one or more electrically conductive connection posts 16 protruding from a side of the device substrate 42, for example a side opposite the components 20. The connection posts 16 are electrically connected to any combination of device interconnections 26, electronic device circuit 46, or component circuits 21 in components 20. The device substrate 42 is electrically connected to destination substrate contact pads 49 on a destination substrate 70 to which the device substrate 42 is affixed or adhered. An adhesive layer 44 can be disposed between first and second semiconductor substrates 22 (e.g., as shown in FIG. 3) and the device substrate 42 and another adhesive layer 44 is disposed between the device substrate 42 and the destination substrate 70.

In some embodiments of the present invention, a device substrate 42 is disposed on a destination substrate 70. The destination substrate 70 can have one or more destination substrate interconnections 52 electrically connected to the destination substrate contact pads 49 such that the device interconnections 26 are electrically connected to the destination substrate interconnections 52 and then, optionally, to an external system, such as a control or operating system. For example, each device interconnection 26 can be electrically connected to a destination substrate interconnection 52. The destination substrate interconnections 52 can comprise different materials from the device interconnection 26 materials. In some embodiments, the destination substrate interconnections 52 are formed at a different native resolution and destination substrate structure separation or size D4 than the native resolution and device substrate structure separation or size D3 of the device interconnections 26 or device circuit 46, for example a relatively lower, coarser native resolution with a relatively larger destination substrate structure separation D4 than the higher, finer resolution and relatively smaller device substrate structure separation or size D3 of the device interconnections 26 (to clarify, FIGS. 3, 4, 10A, 10B are not to scale and the separation distances are not directly comparable). Thus, the destination substrate interconnections 52 can be made at a lower cost than the device interconnections 26. In some embodiments of the present invention, device interconnections 26 comprise device interconnection materials, destination substrate interconnections 52 comprise destination substrate interconnection materials, and one or more of (i) device interconnection materials are different from destination substrate interconnection materials, (ii) the device interconnection materials are made in a different process from the destination substrate interconnection materials, and (iii) the destination substrate interconnections 52 have a different native resolution from the device interconnections 26.

Figure 5:
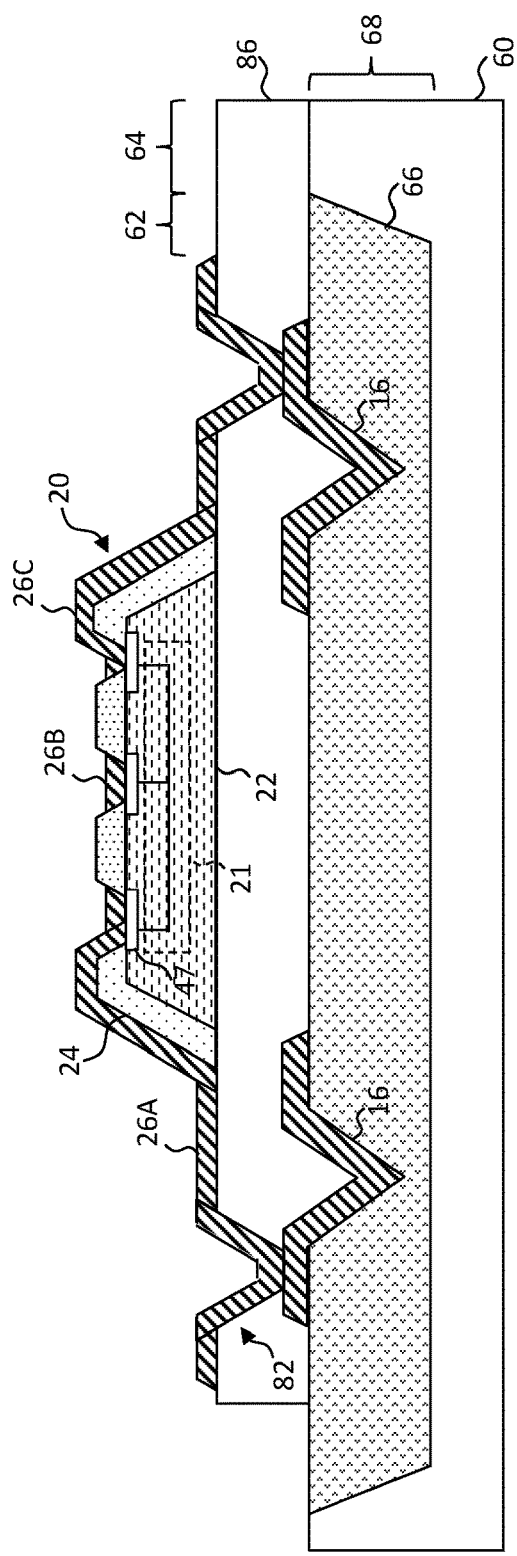
FIGS. 5-6 are cross sections of micro-transfer printable component source wafer portions according to illustrative embodiments of the present invention having connection posts.
Figure 6:
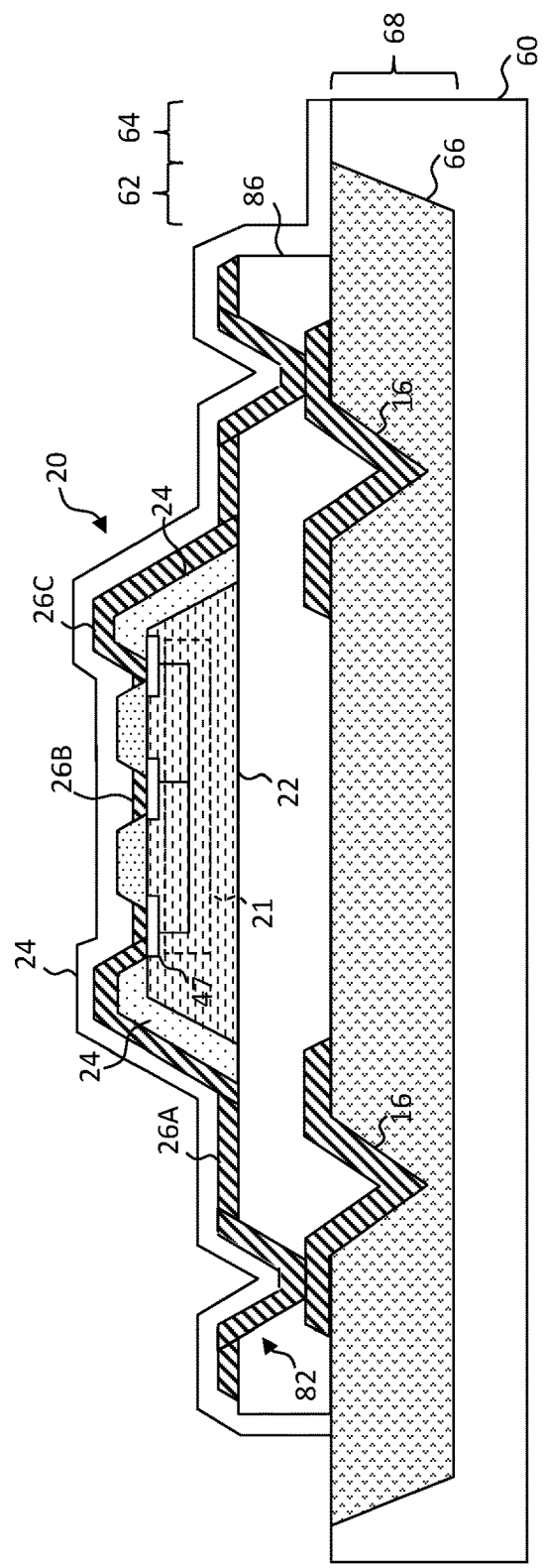

Referring to FIGS. 5 and 6, components 20 can be formed in, on, or over a component source wafer 60 comprising a wafer of substrate material having a patterned sacrificial layer 68 that is formed on or in the substrate material or that is a designated portion of the substrate material. The patterned sacrificial layer 68 defines separate anchors 64 disposed between sacrificial portions 66 of the patterned sacrificial layer 68. A component 20 is formed or disposed over each sacrificial portion 66 and attached to the anchors 64 by one or more tethers 62 disposed over the sacrificial portion 66. The components 20 are electrically connected to connection posts 16 with device interconnections 26A, 26B, 26C (e.g., electrodes 26). Before release (etching) and micro-transfer printing, the tethers 62 are whole and are not broken, fractured, or separated. The micro-transfer printing process renders the unbroken tethers 62 into broken (e.g., fractured) or separated tethers 28. A component semiconductor substrate 22 can be disposed on another substrate 86, for example an oxide or nitride layer such as silicon dioxide or silicon nitride provided over the sacrificial portion 66, and the tether 62 can be a portion of the substrate 86 or a dielectric or encapsulation layer. Electrical connections can be made through a via 82 in a substrate 86 to connection posts 16 from electrodes 26 (as shown in FIGS. 5 and 6, for example).

As shown in the exemplary embodiment in FIG. 6, the component 20 of FIG. 5 includes an encapsulation layer 24 formed at least partially on or over the semiconductor substrate 22. The encapsulation layer 24 can comprise at least a portion of the tether 62, as shown. In such an embodiment, it is useful if the encapsulation layer 24 is chemically etch-resistant or differentially etch resistant with respect to any material of the sacrificial portion 66.

Figure 7:
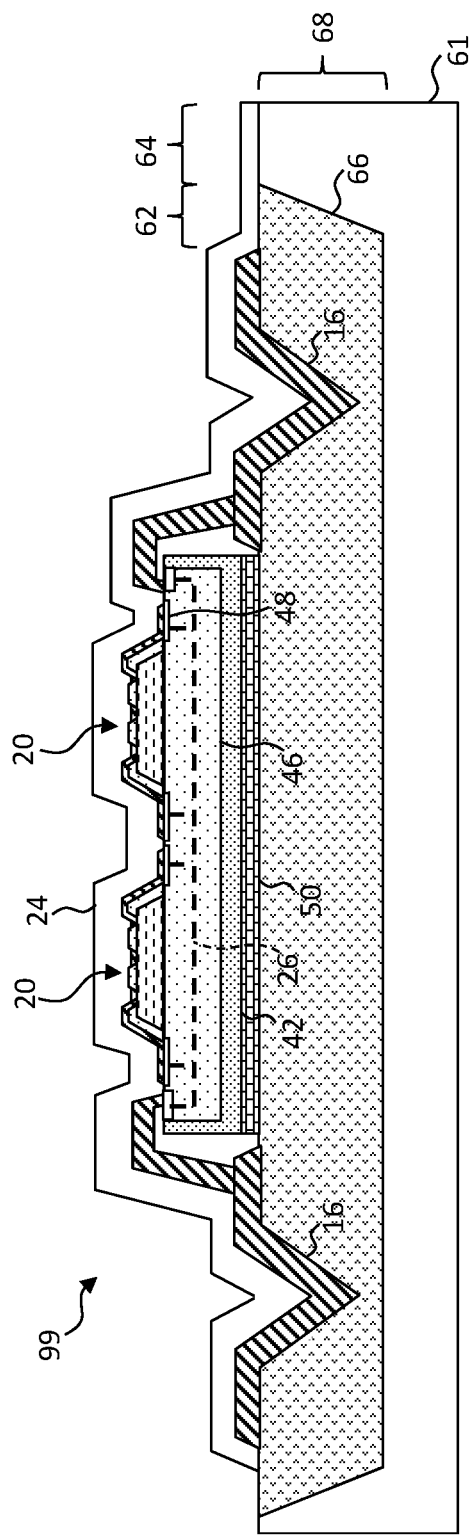
FIG. 7 is a cross section of micro-transfer printable compound device source wafer portions according to illustrative embodiments of the present invention having connection posts.

One or more components 20 can be micro-transfer printed from a component source wafer 60 (e.g., a source wafer 60 in accordance with FIG. 5 or FIG. 6). In some embodiments of the present invention, a compound micro-assembled device 99 can also be transfer printed (e.g., micro-transfer printed). Referring to FIG. 7, a compound device source wafer 61 comprises a wafer of substrate material, for example a semiconductor material or another substrate material such as glass, ceramic, or a polymer, and a patterned sacrificial layer 68 formed on or in the substrate material. The patterned sacrificial layer 68 defines separate anchors 64 between sacrificial portions 66 of the patterned sacrificial layer 68. A compound micro-assembled device 99 is disposed, formed, or assembled over each sacrificial portion 66 and attached to the anchors 64 by one or more tethers 62 over the patterned sacrificial layer 68. In some embodiments of the present invention, a compound micro-assembled device 99 formed or disposed on a compound device source wafer 61 can include a plurality of electrically connected micro-transfer printed components 20 disposed over a common sacrificial portion 66 of a device substrate 42 and the compound device source wafer 61 of substrate material. Each compound micro-assembled device 99 can include an encapsulation layer 24 and the encapsulation layer 24 can form at least a portion of the tether 62 of the compound micro-assembled device 99. After micro-transfer printing the compound micro-assembled device 99 from the compound device source wafer 61, the tethers 62 are broken (e.g., fractured) or separated such that each compound micro-assembled device 99 can include a fractured tether 28 (shown in FIGS. 1A, 1B, 2, 3, and 4).

FIGS. 5 and 6 illustrate exemplary embodiments in which components 20 of the component source wafers 60 comprise connection posts 16. As shown in FIGS. 5 and 6, the components 20 include connection posts 16 electrically connected to a component circuit 21, for example through component contact pads 47 and wires in the component circuit 21. Similarly, FIG. 7 illustrates an exemplary embodiment in which the compound micro-assembled device 99 of the compound device source wafers 61 comprises connection posts 16. A compound micro-assembled device 99 can include connection posts 16 electrically connected to an electronic device circuit 46 or components 20, or both (as shown in FIG. 7), for example through device contact pads 48 and device interconnections 26. The connection posts 16 can be constructed as described, for example, in U.S. patent application Ser. No. 14/822,864, whose contents are incorporated by reference herein.

Figure 8:
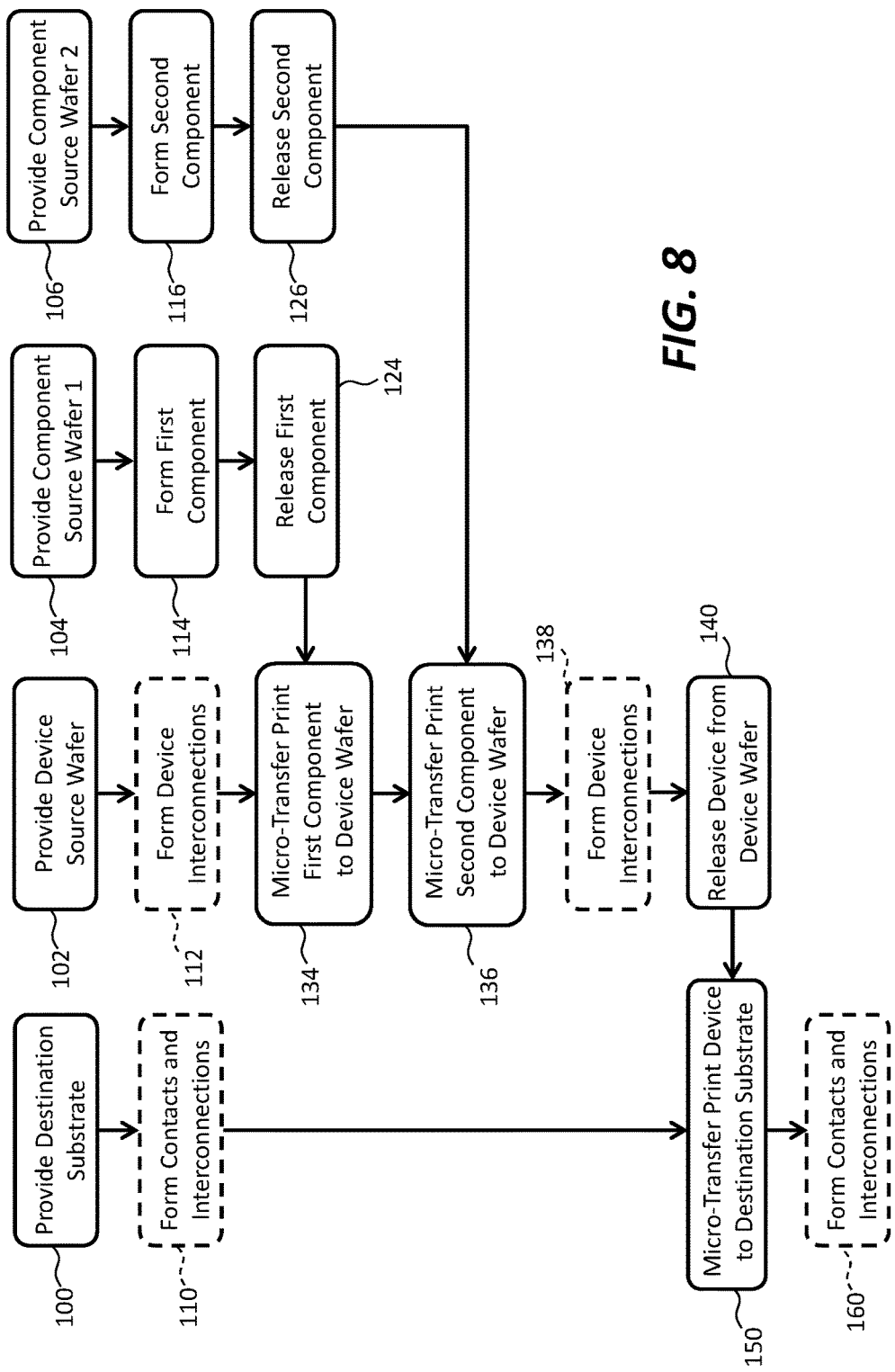
FIGS. 8 and 9 are flow diagrams of illustrative methods of the present invention.

Compound micro-assembled devices 99 can be constructed, according to exemplary methods and referring to FIG. 8, by providing first and second component source wafers 60 in steps 104 and 106 and forming a patterned sacrificial layer 68 on or in the substrate material of each component source wafer 60, the patterned sacrificial layer 68 defining separate anchors 64 between sacrificial portions 66 of the patterned sacrificial layer 68. First components 20A are disposed or formed at a first native resolution over each sacrificial portion 66 of the first component source wafer 60 and each attached to one or more of the anchors 64 by one or more tethers 62 over the sacrificial portion 66 in step 114. Second components 20B are disposed or formed at a second native resolution different from the first native resolution over each sacrificial portion 66 of the second component source wafer 60 and each attached to one or more of the anchors 64 by one or more tethers 62 over the sacrificial portion 66 in step 116. An optional encapsulation layer 24 (e.g., as shown in FIG. 6) can be formed by providing dielectric materials, such as oxides or nitrides over the components 20 and electrodes 26 and can make up at least a portion of the tethers 62. The tethers 62 can be formed and the components 20 released from their respective component source wafers 60 by etching the sacrificial portions 66 to form the one or more tethers 62 connecting the components 20 to the anchor 64 in steps 124 and 126, so that the components 20 can be micro-transfer printed to another substrate, converting the tethers 62 into fractured tethers 28.

In step 102, a compound device source wafer 61 is provided and a patterned sacrificial layer 68 is formed on or in the substrate material of each component source wafer 60, the patterned sacrificial layer 68 defining separate anchors 64 between sacrificial portions 66 of the patterned sacrificial layer 68. Device interconnections 26 are optionally made in step 112 at a device interconnection native resolution. First components 20A are micro-transfer printed from a first component source wafer 60 to a device substrate 42 of the compound device source wafer 61 in step 134 and second components 20B are micro-transfer printed from a second component source wafer 60 to a device substrate 42 of the compound device source wafer 61 in step 136. Device interconnections 26 are optionally made in step 138 at a device interconnection native resolution. Thus, in some embodiments, device interconnections 26 can be made either before (for example interconnecting the components 20 with connection posts 16) or after (for example, using photolithographic thin-film methods to interconnect the micro-transfer printed components 20), or both. Once a compound micro-assembled device 99 is completed, it can be released from the compound device source wafer 61, for example by etching the sacrificial portions 66 of the compound device source wafer 61, in step 140.

A destination substrate 70 can be provided in step 100 and, optionally, contacts and interconnections are formed on the destination substrate 70 in step 110. A compound micro-assembled device 99 can be micro-transfer printed onto the destination substrate 70 in step 150. Contacts and interconnections are optionally made to the compound micro-assembled device 99 after micro-transfer printing in step 160. For example, in some embodiments, if the compound micro-assembled device 99 comprises connection posts 16, at least some device contacts 48 and device interconnections 26 can be made before micro-transfer printing the compound micro-assembled device 99 from a compound device source wafer 61 to the destination substrate 70. For example, in some embodiments, if the compound micro-assembled device 99 does not comprise connection posts 16, at least some of the device contacts 48 and device interconnections 26 can be made after micro-transfer printing the compound micro-assembled device 99 from the compound device source wafer 61 to the destination substrate 70, for example using photolithographic materials and methods to make thin-film metal wires on the destination substrate 70 and over the compound micro-assembled device 99 to contact the device interconnections 26.

In certain embodiments, micro-transfer printing is accomplished by contacting a component 20 or compound micro-assembled device 99 with a stamp, for example an elastomer stamp, having a post (pillar) spatially corresponding to each component 20 or compound micro-assembled device 99 to be printed. By pressing a post against each component 20 or corresponding compound micro-assembled device 99 to fracture the one or more tethers 62 physically connecting the component 20 or compound micro-assembled device 99 to a source wafer, each of the components 20 or compound micro-assembled device 99 is adhered to a post of the stamp, for example adhered with van der Waal's forces. In the case of the component 20 being micro-transfer printed, the stamp and component 20 are then transported to a device substrate 42 and contacted to the device substrate 42 to adhere the component 20 to the device substrate 42. In the case of the compound micro-assembled device 99 being micro-transfer printed, the stamp and compound micro-assembled device 99 are then transported to a destination substrate 70 and contacted to the destination substrate 70 to adhere the compound micro-assembled device 99 to the destination substrate 70. If the components 20 or compound micro-assembled devices 99 comprise connection posts 16, the connection posts 16 are pressed into respective device or destination substrate contact pads 47, 48 on the corresponding device or destination substrate 42, 70. The stamp is then removed.

A sacrificial portion 66 of a component source wafer 60 or compound device source wafer 61 can be a designated portion of an anisotropically etchable crystal, such as a crystalline semiconductor or a crystalline compound semiconductor, a portion that is differentially etchable from the semiconductor materials or the component source wafer 60 or compound device source wafer 61, for example an oxide or nitride material. A sacrificial portion 66 can be etched thereby defining a gap between the semiconductor substrate 22 and the compound device source wafer 60.

Figure 9:
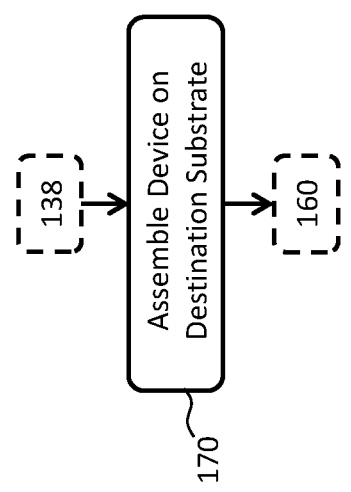

In some embodiments of the present invention, referring to FIG. 9, a compound micro-assembled device 99 is assembled from a compound device source substrate 61 onto a destination substrate 70 using methods other than micro-transfer printing, for example pick-and-place methods and tools. Although components 20 can be so small that only methods such as micro-transfer printing are capable of assembling them on a device substrate 42, in some embodiments the compound micro-assembled device 99 itself can be large enough to assemble on the destination substrate 70 using other methods, for example surface-mount assembly techniques.

In a method in accordance with some embodiments of the present invention, a device substrate 42 is a semiconductor substrate and an electronic device circuit 46 is formed on or in the device substrate 42. The electronic device circuit 46 can be electrically connected to the component 20, for example with metal wires using photolithographic methods. The electronic device circuit 46 can comprise one or more layers on, in, or over the device substrate 42. The layers can comprise one or more of an electrical insulator, a patterned electrical insulator, a dielectric layer 24, a patterned dielectric layer 24, an electrical conductor, a patterned electrical conductor, a transistor, a resistor, a capacitor, and a diode. In some embodiments the components 20 can be micro-transfer printed onto or over at least a portion of the electronic device circuit 46.

In certain embodiments, a device or component semiconductor substrate 42, 22 is any substrate in which active electronic device circuits 46 or component circuits 21 and active electronic elements including semiconductor devices such as transistors, diodes, light-emitting diodes, diode lasers, photodiodes, photodiodes, photo-sensors, or phototransistors can be formed, for example silicon substrates or III-V semiconductor substrates. Device or component semiconductor substrates 42, 22 can also include passive electronic elements, such as conductors, resistors, and capacitors. In some embodiments, a passive electronic element includes only patterned electrical conductors. Device or component semiconductor substrates 42, 22 can include semiconductor material that can be crystalline material such as crystalline silicon suitable for high-performance electronics. Device substrates 42 can include one or more layers of material that are not semiconductor material formed on, in, or over a semiconductor material between a semiconductor material and components 20, for example insulators, patterned insulators, dielectrics, patterned dielectrics, or patterned electrical conductors, and that can be used to form passive electronic devices such as capacitors and resistors and planarizing, electrically insulating, or protective layers.

In some embodiments of the present invention, a device substrate 42 can have two relatively flat and substantially parallel opposing sides and can be any structure having a process side suitable for the deposition, processing, and patterning of active and passive electronic structures useful in forming a passive or active electronic device circuit 46. Such structures can include transistors, diodes, conductors, capacitors, and resistors and include patterned semiconductor structures, doped semiconductor structures, dielectrics such as silicon oxides and silicon nitrides, and conductors such as aluminum, copper, gold, silver, titanium, tantalum, and tin or alloys of such materials. In some embodiments, the device interconnections 26 or other conductors in or connected to components 20 are copper. For example, photolithographic processes for making integrated circuits and device interconnections 26 can be employed with suitable semiconductor device substrates 42. Semiconductor device substrates 42 can include semiconductor materials such as silicon or compound semiconductor materials composed of two or more elements from different groups of the periodic table such as a III-V or II-VI semiconductor. In some embodiments, a device substrate 42 is a crystalline substrate such as a crystalline silicon semiconductor in which circuits, such as CMOS circuits, can be formed using photolithographic processes. In some embodiments, a component semiconductor substrate 22 includes compound semiconductor materials composed of two or more elements from different groups of the periodic table such as a III-V or II-VI semiconductor and is a crystalline semiconductor substrate.

In some embodiments, additional layers of material included in a device substrate 42 are located between a device substrate material and components 20 or adjacent to the components 20. An electronic device circuit 46 can be an active circuit and can include CMOS transistors. In some embodiments, an electronic device circuit 46 includes active elements (e.g., transistors or diodes) electrically connected to components 20 with passive electrical conductors (e.g., wires) such as device interconnections 26 in or on device or component semiconductor substrate 42, 22, for example to control, provide power to, or receive power from, the components 20.

In some embodiments of the present invention, an encapsulation or dielectric layer 24 can be an oxide or nitride, for example silicon oxide, silicon dioxide, silicon nitride, or another insulator. An encapsulation layer 24 can have an extent over a device substrate 42 that is greater than the extent of a component 20 over the device substrate 42. For example, an area of the encapsulation layer 24 can be greater than the extent of the component 20 in a plane substantially parallel to the surface of the device substrate 42 on which the component 20 is transfer printed (e.g., micro-transfer printed) or otherwise disposed. The encapsulation layer 24 can be a chemically etch-resistant encapsulation layer 24, for example silicon nitride. In some embodiments, an encapsulation layer 24 comprises at least a portion of a tether 62. In some embodiments, a compound micro-assembled device 99 also comprises an encapsulation layer, such as an encapsulation layer 24.

A compound micro-assembled device 99 of the present invention can also include a plurality of first and second components 20A, 20B that can have different sizes, respond differently to signals having different frequencies, comprise different sensors, sense different environmental attributes, or provide or switch different amounts of power at different voltages or different currents.

In some embodiments of the present invention, a component source wafer 60 or compound device source wafer 61 includes a substrate comprising a substrate material. Substrate materials include a semiconductor or other material such as oxides, nitrides, glass, or polymer. A patterned sacrificial layer 68 is formed on, over, or in the substrate material or a surface of the substrate material or the substrate. The patterned sacrificial layer 68 defines sacrificial portions 66 that separate anchors 64 between the sacrificial portions 66 of the patterned sacrificial layer 68, for example separating the patterned sacrificial portions 66 in a direction parallel to a surface of the substrate. A chemically selective etch-resistant component substrate 20 or compound micro-assembled device 99 has a chemical selectivity different from the patterned sacrificial layer 68 and is disposed over the patterned sacrificial layer 68 and attached to the anchors 64 by tethers 62 over the patterned sacrificial layer 68. As used herein, an etch-resistant material is a material that resists etching by whatever etchant is used to etch the patterned sacrificial layer 68. Thus, the etchant is a selective etchant. The component source wafer 60 or device source wafer 61 is resistant to whatever etchant is used to etch the patterned sacrificial layer portions 66. A variety of photolithographic methods can be used to make the patterned sacrificial layer 68, the anchors 64, and the tethers 62 that connect the component semiconductor substrates 22 to the anchors 64.

In some embodiments of the present invention, a patterned sacrificial layer 68 is a patterned layer of etchable material formed on or in a substrate or substrate material, for example an oxide layer such as silicon dioxide, that can be etched without etching a component semiconductor substrate 22, encapsulation or dielectric layer 24, or device substrate 42. In some embodiments, a patterned sacrificial portion 66 is a defined portion of the substrate material that is anisotropically etchable. For example, a substrate material can be crystalline silicon with a <1 0 0> crystal orientation or a <1 1 1> orientation that enables the substrate material to be anisotropically etched to form gaps in the sacrificial portions 66 and anchors 64 in the substrate without etching the component semiconductor substrate 22, device substrate 42, or encapsulation layer 24. In some embodiments, a substrate material is a compound semiconductor such as GaAs or InP and the sacrificial portions 66 are a defined portion of the substrate material that is anisotropically etchable. In some embodiments, a patterned sacrificial layer 68 comprises sacrificial portions 66 that are etched thereby each defining a gap between an etch-resistant component semiconductor substrate 22 and a substrate material in a source wafer. Thus, the gap can be an etched patterned sacrificial layer 68 portion 66 that has been sacrificed, i.e., the material of the sacrificial portion 66 has been removed by etching, so that the components 20 are ready to be micro-transfer printed to another substrate, for example the device substrate 42 of the compound micro-assembled device 99 or a destination substrate 70.

In some embodiments of the present invention, a compound semiconductor source wafer comprises a wafer of semiconductor material, wherein the semiconductor material is a compound semiconductor, the wafer having a patterned sacrificial layer 68 of the semiconductor material, the patterned sacrificial layer 68 defining separate anchors 64 between sacrificial portions 66 of the patterned sacrificial layer 68, and a device including the semiconductor material formed over each sacrificial portion 66 and attached to the anchors 64 by one or more tethers 62 over the sacrificial portion 66. The device can be a device for generating, controlling or responding to electricity, for processing information, a device for generating, controlling, or responding to magnetism or magnetic fields, a device for generating, controlling, or responding to an electrical field, or a device for generating, controlling, or responding to light. The device can be a component 20 and the compound semiconductor can be GaAs, GaN, InGaN, or InP.

For a discussion of micro-transfer printing techniques see U.S. Pat. Nos. 8,722,458, 7,622,367 and 8,506,867, the disclosure of each of which is hereby incorporated by reference in its entirety. Micro-transfer printing using compound micro-assembly structures and methods can also be used in certain embodiments of the present invention, for example as described in U.S. patent application Ser. No. 14/822,868, filed Aug. 10, 2015, entitled Compound Micro Assembly Strategies and Devices, which is hereby incorporated by reference in its entirety. U.S. patent application Ser. No. 14/743,981, filed Jun. 18, 2015, entitled Micro Assembled LED Displays and Lighting Elements, incorporated by reference herein describes micro-transfer printing structures and processes useful with compound micro-assembled devices 99 in certain embodiments of the present invention.

Components 20 are mounted upon, for example transfer printed (e.g., micro-transfer printed) upon or otherwise adhered to a device substrate 42. As intended herein, to be mounted upon means that separate substrates are separately produced and then brought into proximity and adhered together in some fashion, for example by micro-transfer printing. Component semiconductor substrates 22 can be, for example, unpackaged bare die such that the component semiconductor substrate 22 is in direct contact with a device substrate 42 or with an adhesive layer 44 that is in direct contact with the device substrate 42 and the component semiconductor substrate 22. To be mounted upon an electronic device circuit 46 or a device substrate 42 means that a component semiconductor substrate 22 or device substrate 42 is mounted upon any of the elements of the electronic device circuit 46, for example upon a semiconductor layer, a patterned or doped semiconductor layer or structure, a conductor layer or patterned conductor, a dielectric layer, a patterned dielectric layer, a protective layer, or any other element of the electronic device circuit 46, layers on the device substrate 42, or the device substrate 42.

An electronic device circuit 46 is a circuit that includes at least one of active and passive elements. For example, an active electronic device circuit 46 can include one or more of a transistor, an amplifier, and a switch. Passive elements such as conductors, resistors, capacitors, and inductors can also be included in the active electronic device circuit 46. Elements of an active electronic device circuit 46 are electrically connected to circuit contact pads 48. The circuit contact pads 48 are portions of the active electronic device circuit 46 that are available to make electrical connections with electrical devices external to the active electronic device circuit 46, for example such as controllers, power supplies, ground, or signal connections. Circuit contact pads 48 can be, for example, rectangular areas of electrically conductive materials such as the conductors listed above, accessible or exposed to external elements such as wires or conductors. Electrical connections to the circuit contact pads 48 can be made using solder and solder methods, photo-lithographic processes, or by contacting and possibly penetrating the circuit contact pads with electrically conductive protrusions or spikes (e.g., connection posts 16) formed in or on a device with another substrate separate, distinct, and independent from the device substrate 42 and connected to a circuit, for example as described in U.S. patent application Ser. No. 14/822,864 entitled Chiplets with Connection Posts, whose content is incorporated by reference herein in its entirety. In some embodiments, compound micro-assembled devices 99 includes connection posts 16 that are printed onto contact pads 48 of a destination substrate 70.

Device substrates 42 and component semiconductor substrates 22 can take a variety of forms, shapes, sizes, and materials. In some embodiments, a component 20 is thinner than a device substrate 42. In some embodiments, a component 20 is thicker than a device substrate 42. A device substrate 42 can have a thickness less than 20 microns, less than 10 microns, or less than 5 microns. A component semiconductor substrate 22 can have a thickness less than 10 microns, less than 5 microns, or less than 1 micron. In some embodiments, a component semiconductor substrate 22 has a thickness greater than 0.5 microns, greater than 1 micron, greater than 2 microns, or greater than 5 microns. Such a variety of sizes can enable highly integrated and small structures useful in a corresponding variety of electronic systems. A component 20 can have a variety of thicknesses, for example a thickness in the range of 10 nm to 10 microns. Tethers 62 can have a thickness of several nm (e.g., 50, 100, 200, 500, 700, or 800 nm) to a few µm (e.g., 1-5 µm), for example 600 nm to 1.5 µm.

In some embodiments of the present invention, components 20 are chiplets, small integrated structures, for example bare die, that are transfer printed (e.g., micro-transfer printed) to a device substrate 42 and electrically connected, for example using wires formed by photolithographic materials and methods or with connection posts 16 and contact pads 48. An integrated compound micro-assembled device 99 can be subsequently packaged. In various embodiments, device substrates 42 or components 20 each have at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 5 to 10 µm, 10 to 20 µm, or 20 to 50 µm. In certain embodiments, such small substrate elements provide a high degree of integration and material utilization and consequently reduced manufacturing costs and improved performance. An integrated compound micro-assembled device 99 can be a surface-mount device.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a patterned sacrificial layer 68 or sacrificial portion 66 is considered "on" a substrate when a layer of sacrificial material or sacrificial portion 66 is on top of the substrate, when a portion of the substrate itself is the patterned sacrificial layer 68, or when the patterned sacrificial layer 68 or sacrificial portion 66 comprises material on top of the substrate or a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components or elements, or where processes and methods are described as having, including, or comprising specific steps, it is contemplated that, additionally, there are apparatus, and systems of the disclosed technology that consist essentially of, or consist of, the recited components or elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross-section line
D1 first component structure separation/size
D2 second component structure separation/size
D3 device substrate structure separation
D4 destination substrate structure separation
16 connection post
20 component
20A first component
20B second component
20C third component
20D fourth component
21 component circuit
22 semiconductor/component substrate
22A first semiconductor/component substrate
22B second semiconductor/component substrate
24 encapsulation layer/dielectric layer/dielectric
26, 26A, 26B, 26C, 26D, 26E device interconnection/electrode
28 fractured tether
42 device substrate
44 adhesive layer
46 device circuit
47 component contact pad
48 device contact pad
49 destination substrate contact pad
50 heat spreader
52 destination substrate interconnections
60 component source wafer
61 compound device source wafer
62 tether
64 anchor
66 sacrificial portion
68 patterned sacrificial layer
70 destination substrate
82 via
86 substrate
99 compound micro-assembled device
100 provide destination substrate step
102 provide device source wafer step
104 provide component source wafer 1 step
106 provide component source wafer 2 step
110 optional form contacts and interconnections step
112 optional form device interconnections step
114 form first component step
116 form second component step
124 release first component step
126 release second component step
134 micro-transfer print first component to device wafer step
136 micro-transfer print second component to device wafer step
138 optional form device interconnections step
140 release device from device wafer step
150 micro-transfer print from device wafer to destination substrate step
160 optional form contacts and interconnections step
170 assemble device on destination substrate step

What is claimed:

1. A compound micro-assembled device, comprising:
a device substrate;
a first component having a first component native resolution, the first component disposed on the device substrate;
a second component having a second component native resolution different from the first component native resolution, the second component disposed on the device substrate; and
one or more device interconnections electrically connecting the first component to the second component on the device substrate,
wherein at least one of the first component, the second component, and the device substrate comprises at least a portion of a tether, and
wherein the first component native resolution is defined by the smallest of (i) a smallest structure and (ii) a smallest spacing between two structures defined in the first component, and
wherein the second component native resolution is defined by the smallest of (i) a smallest structure and (ii) a smallest spacing between two structures defined in the second component.

2. The compound micro-assembled device of claim 1, wherein the first component is formed at least partially in a first material, the second component is formed at least partially in a second material, and the first and second materials are a same material.

3. The compound micro-assembled device of claim 2, wherein the same material is a semiconductor material forming a component substrate for the first component and for the second component.

4. The compound micro-assembled device of claim 1, wherein the device substrate comprises a device material that is a semiconductor material.

5. The compound micro-assembled device of claim 4, wherein the first component is formed at least partially in a first material, the second component is formed at least partially in a second material, and the first material, the second material, and the device material are a same material.

6. The compound micro-assembled device of claim 4, wherein the first component is formed at least partially in a first material, the second component is formed at least partially in a second material, and the device material comprises a same material as the first material or the second material.

7. The compound micro-assembled device of claim 4, wherein the first component is formed at least partially in a first material, the second component is formed at least partially in a second material, and the first material, the second material, and the device material are each a different material.

8. The compound micro-assembled device of claim 4, wherein the device substrate comprises a device circuit disposed in or on the device material and the device circuit is electrically connected to at least one of the one or more device interconnections.

9. The compound micro-assembled device of claim 8, wherein the device circuit has a device native resolution.

10. The compound micro-assembled device of claim 9, wherein the device native resolution is different from the first component native resolution and different from the second component native resolution.

11. The compound micro-assembled device of claim 1, wherein the first component and the second component are micro-transfer printed onto the device substrate and each of the first component and the second component comprises at least a portion of a fractured or separated tether.

12. The compound micro-assembled device of claim 1, comprising a destination substrate comprising one or more destination substrate interconnections, the device substrate is disposed on the destination substrate, and the one or more device interconnections are electrically connected to the one or more destination substrate interconnections.

13. The compound micro-assembled device of claim 1, wherein the device interconnections have a device native resolution that is less than the first component native resolution or the second component native resolution.

14. The compound micro-assembled device of claim 1, wherein the device interconnections have a device native resolution that is less than the first component native resolution and less than the second component native resolution.

15. A method of making a compound micro-assembled device, comprising:
providing a device substrate comprising one or more device interconnections;
providing a first component having a first component native resolution on a first source wafer, wherein the first component native resolution is defined by the smallest of (i) a smallest structure and (ii) a smallest spacing between two structures defined in the first component;
providing a second component having a second component native resolution different from the first component native resolution, disposed on the device substrate, wherein the second component native resolution is defined by the smallest of (i) a smallest structure and (ii) a smallest spacing between two structures defined in the second component;
micro-transfer printing the first component from the first source wafer onto the device substrate such that the first component comprises at least a portion of a fractured or separated tether after printing; and
electrically connecting the first component to the one or more device interconnections, and wherein the second component is electrically connected to the one or more device interconnections.

16. The method of claim 15, comprising:
providing the second component on a second source wafer; and
micro-transfer printing the second component from the second source wafer onto the device substrate such that the second component comprises at least a portion of a fractured or separated tether after printing; and
electrically connecting the second component to the one or more device interconnections.

17. The method of claim 15, comprising forming the one or more device interconnections after the first component is micro-transfer printed.

18. The method of claim 15, comprising forming the one or more device interconnections by micro-transfer printing.

19. The method of claim 15, comprising:
disposing the device substrate on or in a device source wafer;
providing a destination substrate comprising one or more destination substrate interconnections;
after electrically connecting the first component to the one or more device interconnections, micro-transfer printing the device substrate from the device source wafer onto the destination substrate such that the device substrate comprises at least a portion of a fractured or separated tether; and
electrically connecting the one or more device interconnections to the one or more destination substrate interconnections.

20. The method of claim 19, wherein micro-transfer printing the device substrate causes one or more of the one or more device interconnections to be electrically connected to one or more of the one or more destination substrate interconnections.

21. The method of claim 15, wherein micro-transfer printing the first component causes the first component to be electrically connected to the one or more device interconnections.

22. A compound micro-assembled device, comprising:
a device substrate;
a first component having a first native resolution, the first component disposed on the device substrate;
a second component having a second native resolution different from the first native resolution, the second component disposed on the device substrate; and
one or more device interconnections electrically connecting the first component to the second component on the device substrate,
wherein at least one of the first component, the second component, and the device substrate comprises at least a portion of a tether,
wherein the device substrate comprises a device material that is a semiconductor material,
wherein the device substrate comprises a device circuit disposed in or on the device material and the device circuit is electrically connected to at least one of the one or more device interconnections,
wherein the device circuit has a device native resolution, and
wherein the device native resolution is the same as one of the first native resolution and the second native resolution.

23. A compound micro-assembled device, comprising:
a device substrate;
a first component having a first native resolution, the first component disposed on the device substrate;
a second component having a second native resolution different from the first native resolution, the second component disposed on the device substrate; and
one or more device interconnections electrically connecting the first component to the second component on the device substrate,
wherein at least one of the first component, the second component, and the device substrate comprises at least a portion of a tether,
wherein the device substrate comprises a device material that is a semiconductor material,
wherein the device substrate comprises a device circuit disposed in or on the device material and the device circuit is electrically connected to at least one of the one or more device interconnections,
wherein the device circuit has a device native resolution, and
wherein the device native resolution is less than the first native resolution and less than the second native resolution.

24. A compound micro-assembled device, comprising:
a device substrate;
a first component having a first native resolution, the first component disposed on the device substrate;
a second component having a second native resolution different from the first native resolution, the second component disposed on the device substrate;
one or more device interconnections electrically connecting the first component to the second component on the device substrate; and a destination substrate comprising one or more destination substrate interconnections, the device substrate is disposed on the destination substrate, and the one or more device interconnections are electrically connected to the one or more destination substrate interconnections, wherein at least one of the first component, the second component, and the device substrate comprises at least a portion of a tether, and wherein the one or more device interconnections comprise one or more device interconnection materials and the one or more destination substrate interconnections comprise one or more destination substrate interconnection materials, and wherein at least one of (i) the one or more device interconnection materials are different from the one or more destination substrate interconnection materials, and (ii) the one or more destination substrate interconnections have a different native resolution from the one or more device interconnections.

25. A compound micro-assembled device, comprising:
a device substrate;
a first component having a first native resolution, the first component disposed on the device substrate;
a second component having a second native resolution different from the first native resolution, the second component disposed on the device substrate;
one or more device interconnections electrically connecting the first component to the second component on the device substrate; and
a destination substrate comprising one or more destination substrate interconnections, the device substrate is disposed on the destination substrate, and the one or more device interconnections are electrically connected to the one or more destination substrate interconnections, wherein at least one of the first component, the second component, and the device substrate comprises at least a portion of a tether, and wherein the one or more device interconnections comprise one or more device interconnection materials and the one or more destination substrate interconnections comprise one or more destination substrate interconnection materials and the one or more device interconnection materials are made in a different process from the one or more destination substrate interconnection materials.

* * * * *